United States Patent [19]

Van Brunt et al.

[11] Patent Number: 4,547,623

[45] Date of Patent: Oct. 15, 1985

[54] CABLE SHIELD GROUNDING APPARATUS

[75] Inventors: Michael K. Van Brunt, Playa del Rey; Peter Madle, Redondo Beach, both of Calif.

[73] Assignee: Automation Industries, Inc., Greenwich, Conn.

[21] Appl. No.: 540,127

[22] Filed: Oct. 7, 1983

[51] Int. Cl.[4] ........................ H02G 15/02; H05K 9/00

[52] U.S. Cl. ............................ 174/35 R; 174/65 SS; 285/158

[58] Field of Search .................. 174/35 R, 65 SS, 78; 285/158

[56] References Cited

U.S. PATENT DOCUMENTS

| | | | |
|---|---|---|---|
| 3,448,430 | 6/1969 | Kelly | 174/78 X |
| 3,739,076 | 6/1973 | Schwartz | 174/65 SS X |
| 3,830,957 | 8/1974 | Oberdiear | 174/65 SS X |
| 4,022,966 | 5/1977 | Gajajiva | 174/78 X |
| 4,032,205 | 6/1977 | Taj | 174/78 X |
| 4,362,898 | 12/1982 | Zendle et al. | 174/35 R |

*Primary Examiner*—A. T. Grimley
*Assistant Examiner*—Terry Flower
*Attorney, Agent, or Firm*—Thomas L. Flattery

[57] ABSTRACT

A pair of hollow cylindrical parts are received onto a shielded cable and can be threaded together to clampingly engage conductive rings pressing them into full circumferential contact with the cable shield. One of the cylindrical parts is secured to a suitable electrical ground point (e.g., welding to deck of ship).

8 Claims, 4 Drawing Figures

CABLE SHIELD GROUNDING APPARATUS

The present invention relates generally to the grounding of shielded cables, and, more particularly, to apparatus for mounting onto a shielded cable and grounding the shield to a grounding plane through which the cable passes, such as a wall, deck of a ship, floor of a vehicle, or the like.

BACKGROUND

There are many situations in which a shielded cable is exposed to large electromagnetic fields and it is necessary to remove the induced voltages in the shield so that they will not be carried along the cable to a point where they would interfere with equipment to which the cable is interconnected. For example, on board ship there are frequent connections between equipment located above deck to other remotely located equipment below deck via shielded cables exposed to substantial electromagnetic energy, such as from the ship's radar, for example. It is accordingly essential to ground the cable shield to the deck or adjacent superstructure of the ship before the cable passes below deck to utilization equipment which would either be damaged or substantially interfered with by the electromagnetic energy induced voltage in the cable shield. This is a particularly severe problem in naval craft where the electromagnetic field produced by their radar produces a local electromagnetic field of a relatively high level.

In the past, grounding of cables under these circumstances has been accomplished simply by interconnecting a single element conductor (so-called "pigtail") between the cable shield and ground which, in the present case, would be the ship'deck. Such interconnection was at a limited point on the shield and would not be satisfactory for removing induced voltages produced by high level electromagnetic fields to the extent necessary to keep interference within accepted limits. Also, frequently pigtail connections left exposed parts of the shield which could result in deterioration of the shield and/or connection resulting from adverse environmental factors.

SUMMARY OF THE INVENTION

Prior to incorporating the grounding apparatus to be described, a band of the outer cable insulation material is removed leaving exposed a ring of the cable shielding material extending 360 degrees about the cable. First and second conductive metal rings are located on the cable over the exposed shielding material. The inner dimensions of the conductive rings are such as to provide a general and continuous contacting relationship with the shielding material at this time. In between the conductive rings and outside each of the rings there are provided resilient rings constructed of a material such as neoprene, for example. A metal plate of a width exceeding that of the conductive copper rings with insulative rings at each side is formed into an annulus extending over and about the conductive rings in contacting relation thereto.

A hollow, cylindrical part with an inner diameter at one end permitting sliding receipt over the entire cable and a larger inner diameter at the opposite end tapering axially inwardly is located on the cable and over the exposed shielding material. A pair of flexible, insulative rings with a conductive metal ring located therebetween are of such dimensions as to permit receipt within the cylindrical part over the conductive plate and in contacting relationship with the plate. A hollow, tubular, pressure grommet having a beveled outer surface is located within the larger opening end of the cylindrical part, with its beveled surface flush against the tapering inner surface of the cylindrical part.

A cap having an opening therethrough permitting receipt onto the cable includes a set of internal threads for mating with threads on the outer surface of the cylindrical part, and when so related drives the pressure grommet against the larger set of conductive and insulative rings serving to produce a firm 360 degree contacting relation between the cylindrical part, through the outer copper rings, conductive plate, and inner or smaller conductive rings directly onto the shielding of the cable. An insulative boot is slid onto the cable and received over the cap to prevent the ingress of moisture, dirt, dust and other foreign material to the situs of the shielding connection.

When the various parts of the shielding apparatus are in place on the cable a described, the hollow cylindrical part is welded to the deck wall or other grounding plane at the point where the cable passes therethrough. The welding is preferably accomplished 360 degrees about the tube in order to make sure full takeoff of any voltages induced into the cable shielding means is achieved.

DESCRIPTION OF A PREFERRED EMBODIMENT

Figure 1:
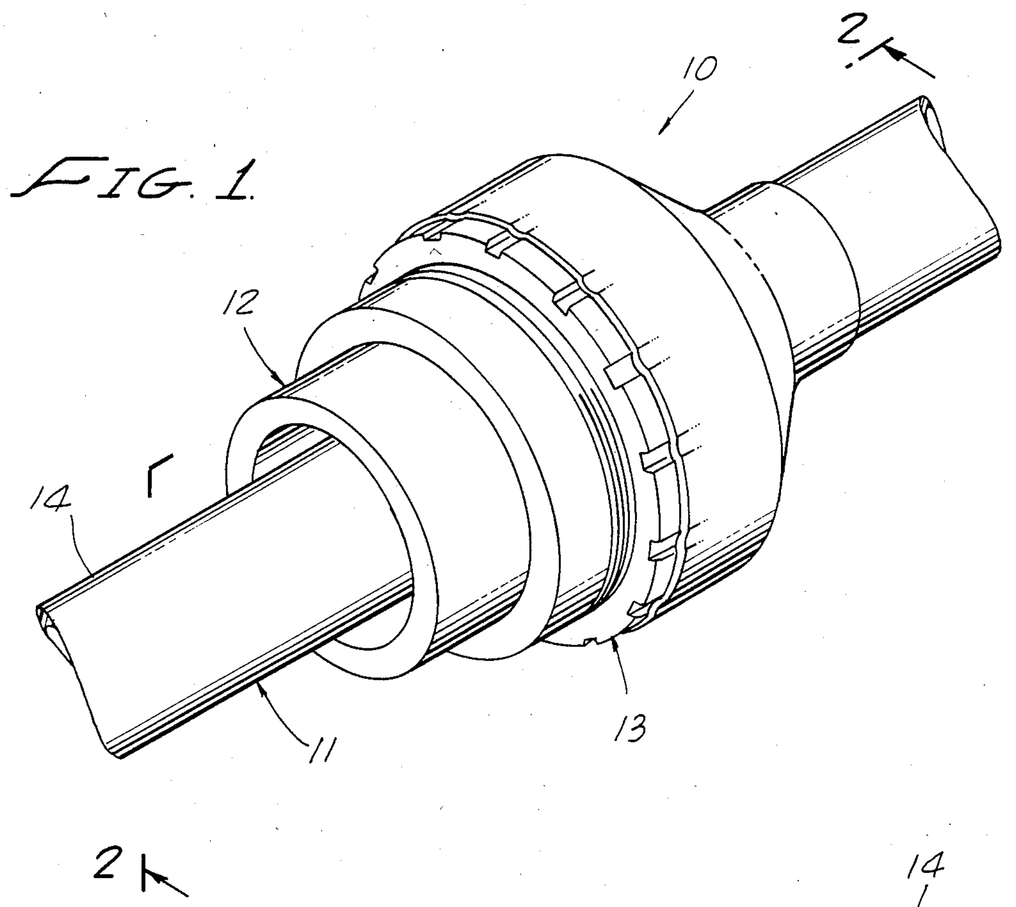
FIG. 1 is a perspective view of the cable shield grounding apparatus of this invention shown in place on a cable.

Turning now to the drawings and particularly FIG. 1, the cable shield grounding apparatus to be described is identified generally as at 10 and is shown in place on a cable 11. In its major external aspects, the grounding apparatus 10 includes a first hollow metal cylindrical part 12 which is received on the cable and onto which is threaded a cylindrical metallic cap 13. As will be described later herein, there are internal parts which effect a 360 degree electrical contacting relation between the cable shield (not shown in FIG. 1) to the metal housing 12. After the grounding apparatus is fully assembled and in place on the cable, the cylindrical part 12 is welded to the ship deck, as at 43, metal wall member or other ground plane thereby effecting the final step of the required grounding.

Figure 2:
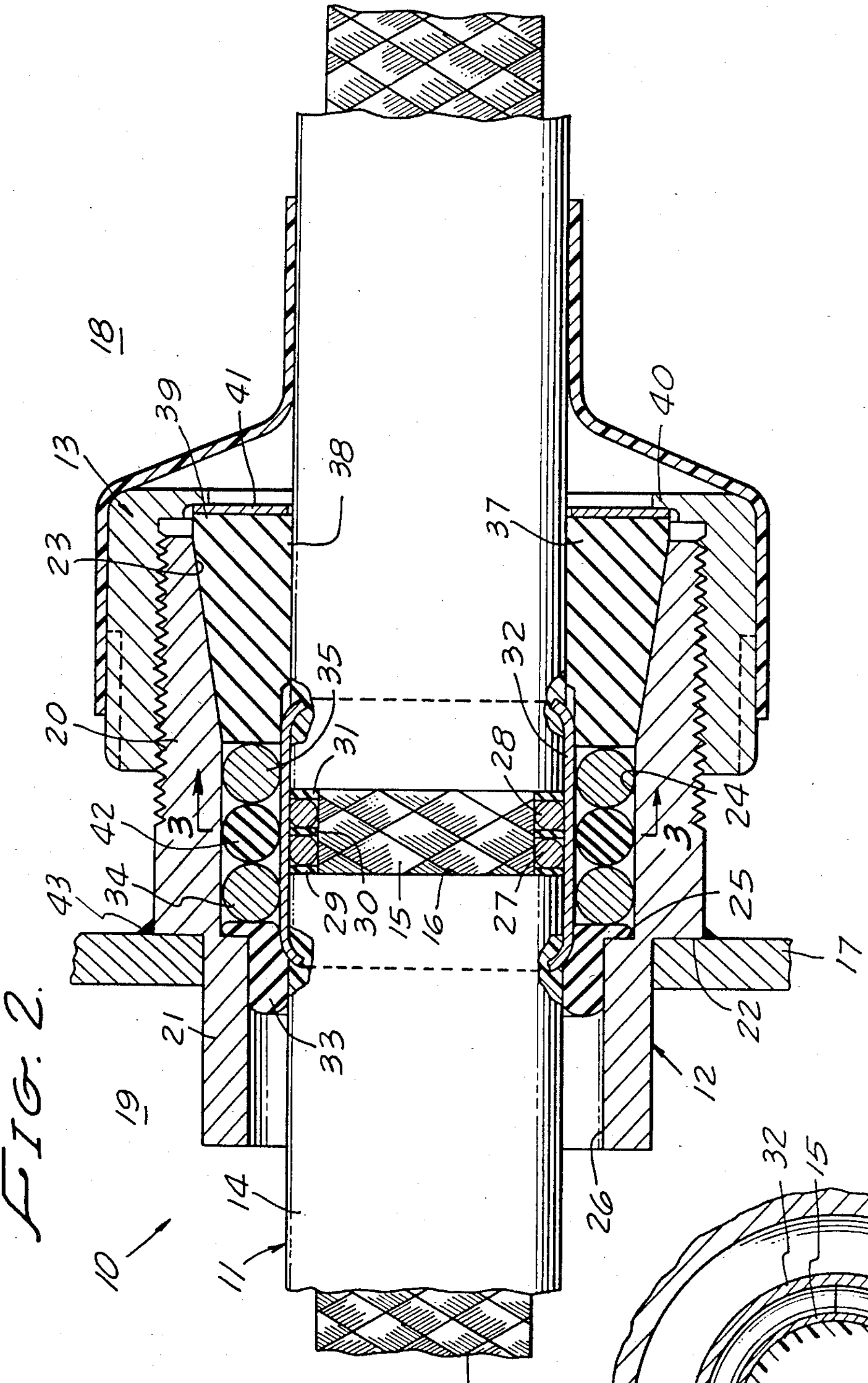
FIG. 2 is a side elevational sectional view taken along the line 2—2 of FIG. 1.
Figure 3:
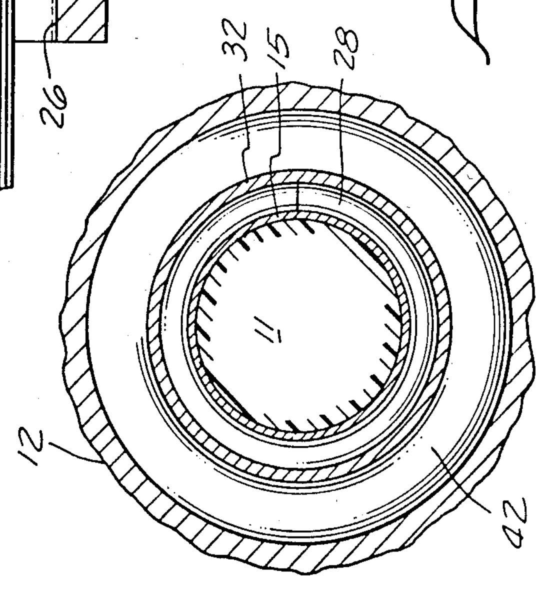
FIG. 3 is an end elevational sectional view taken along the line 3—3 of FIG. 2.

For the ensuing description of the grounding apparatus reference is now made to FIG. 2 where the cable 11 is seen to include an outer layer of insulative material 14 immediately under which is a continuous metallic shield 15 which is depicted as a metal braid for illustrative purposes. Prior to assembling the grounding apparatus to the cable, the cable has a strip of the insulative material 14 of predetermined width removed forming an exposeed strip or area 16 of the shield and it is to this shield strip that grounding connection is to be made.

It is also assumed, as a setting for illustration of operation and use of the grounding means, that a conductive wall 17, such as the deck of a chip for example, divides a first region identified generally as 18 in which a relatively high electromagnetic interference field exists from a further region identified as 19 in which there are situated apparatus interconnected with the cable 11 that it is desired to protect against the unwanted interference from voltages and currents induced by electromagnetic energy from the region 18. Moreover, it is also assumed that this wall 17 is substantial enough so that the part 12 may be welded to it.

The cylindrical part 12 has a relatively large diameter opening end 20, the exterior surface of which is threaded and the opposite end 21 includes a smaller diameter opening. An external shoulder 22 separates the two diameter portions 20 and 21 and as will be shown serves as mounting surface when the grounding apparatus is located within the grounding plane or wall 17. The inner wall surface of the large diameter end portion 20 is tapered as at 23 for an extent to a lesser diameter point immediately adjacent to which there is a further extent 24 of a uniform internal diameter. The uniform diameter part 24 terminates in an internal shoulder 25 which separates the uniform diameter section 24 from the exit opening 26 for the end 21.

Figure 4:
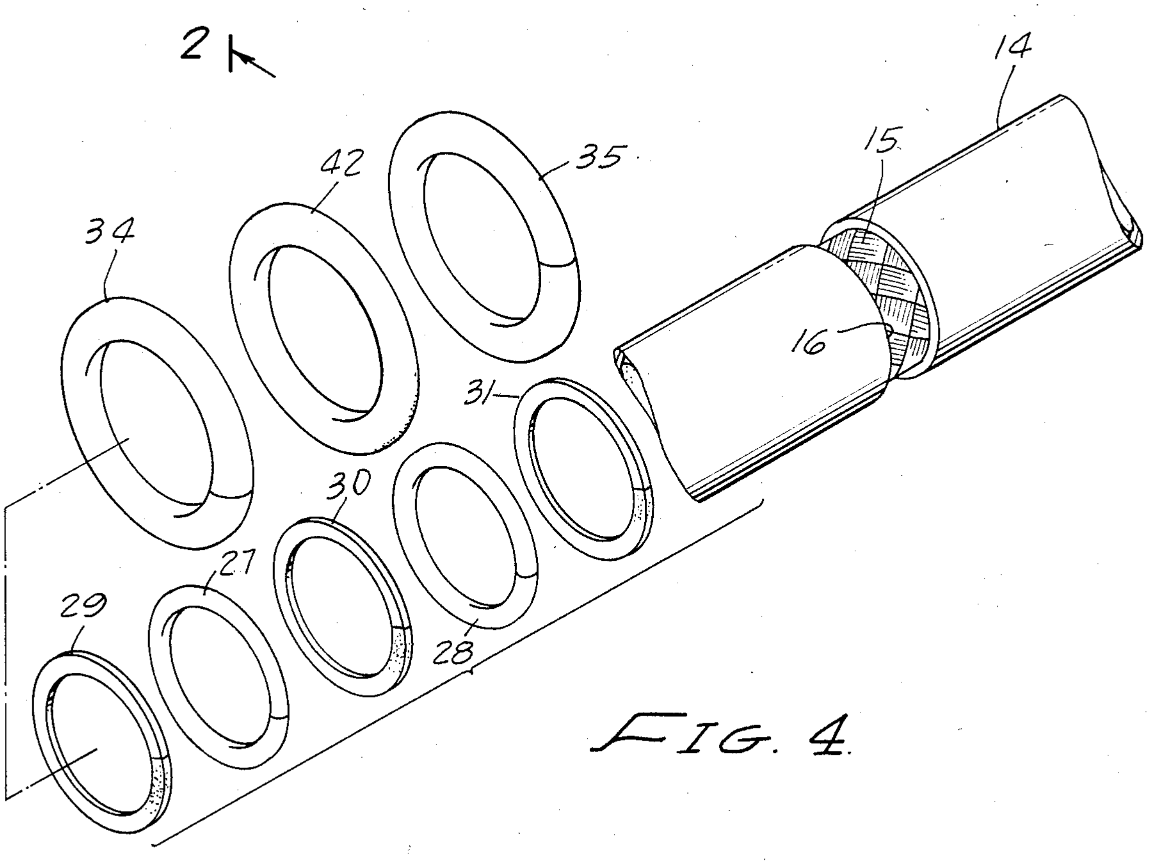
FIG. 4 is an exploded view of the cable and various pressure rings used in the grounding apparatus.

First and second conductive metal rings 27 and 28 having a thickness slightly larger than the cable insulation 14 are located within the exposed shield strip area 16. As can be seen in FIG. 4, the rings 27 and 28 are split so that they may be slipped over the cable and located in place on the cable shield. The inner diameters of the rings 27 and 28 are such that when in place (FIG. 2), they will contact the outer surface of the shield 15 substantially continuously completely about the cable. The rings 27 and 28 are preferably constructed of a good conductive metal, such as copper, with the ring surface being maintained free of any insulative material.

Three insulative spacer rings 29, 30 and 31, constructed of a flexible insulative material such as neoprene, are located between the two conductive rings 27 and 28 at each of the outer sides thereof, respectively. Again, as in the case of the conductive rings, the insulative spacer rings each have a transverse slot via which the ring may be assembled onto the cable.

The width of the removed insulation forming the strip 16 and the comparative dimensions of the insulator rings 29–31 and conductive rings 27–28 are such that there is a snug fitting relationship of the various rings within the space 16. It is an important final spatial result that the conductive rings 27 and 28 when their inner surfaces are brought into contact with the outer surface of the shield 15, the ring outer surfaces will extend slightly above the surface of the cable insulation 14.

A highly conductive slotted metal plate 32 of a width substantially greater than the width of the strip 16 is located over the strip and rings 27–31, and formed into an annulus fitting completely about the cable with the plate inner surface contacting the conductive rings 27–28.

A rubber grommet 33 is received within the opening 23 sealing off the space between the inner wall defining opening 24 and the annular plate 32.

A further pair of conductive rings 34, 35 of a diameter larger than rings 27 and 28 and the cross-sectional dimension also exceeding those of the first described rings, are positioned about the plate 32 and have internal diameters permitting full contacting relation to the outer plate surface. The outer dimensions of the conductive rings 34 and 35 are such that when they are positioned on the plate 32, they will just contact the inner wall surface of the uniform diameter portion 24 as can be seen best in FIG. 2. As shown in FIG. 4, the rings 34 and 35 as well as the rings 27 and 28 have a split body wall and are made of a sufficiently deformable material to enable mounting the rings onto the cable from the side rather than having to slip them along the full length of the cable.

Intermediate the two larger conductive rings, there is located a flexible and resilient O-ring 42 constructed of a material such as neoprene serving to hold the conductive rings in separated condition and also as a force transmitting means therebetween. The relative dimensions of these parts are such that when fully in place on the plate 32, the conductive rings 34 and 35 are located just outwardly of the strip 16 and over the cable insulation.

A pressure grommet 37 constructed of a resilient and flexible insulative material has a major inner diameter 38 such that when it is received onto the cable over the insulation 14 it forms a snug fit. The outer surface of the grommet 37 is tapered so that it can conform to the complementary tapering surface 23 in the larger open end of the part 12. A portion of the inner end of the grommet is removed as at 39 such that when the grommet is fitted within the cylindrical part 12, the grommet will not interfere with the end of the plate 32, but readily slide thereover.

The cylindrical cap 13 has a set of threads on its interior surface permitting threaded receipt onto a similar set of threads on the cylindrical part 12. An inwardly directed flange 40 on the cap contacts a thin metallic washer 41 which, in turn, contact pressure grommet 37 and urges it inwardly against the conductive ring 35 when the cap is threaded onto part 12. By this action, a firm and continuous 360 degree electrical contact is established between the cylindrical metal part 12 through conductive rings 34 and 35, plate 32, and conductive rings 27 and 28 to the shield 15. The pressure grommet insures that all the various parts are tightly and fully contacting one another and throughout the full periphery of the cable.

We claim:

1. A device for establishing connection between electrical ground and a cable shield, comprising:

a cable having an external shield;

first and second hollow metallic cylindrical means received on the cable over the cable shield, said cylindrical means including threads for releasably joining said cylindrical means to one another;

generally annular conductive means located about the cable shield and within at least one of the cylindrical means including first ring means with a bore enabling contacting receipt about the cable shield, an annular metal plate received about the first ring means, and second ring means received about said annular metal plate, said first and second ring means and annular metal plate being clampingly engaged by the threading of said first and second cylindrical means together to effect electrical contact between the cable shield and said first and second cylindrical means; and means for conductively affixing one of the cylindrical means to electrical ground.

2. A device as in claim 1, in which grommet means are received with one of the cylindrical means, said grommet means being driven against the annular conductive means on threading of the first and second cylindrical means together in such direction as to urge the annular means into contact with both the cable shield and a surface of a cylindrical means.

3. A device as in claim 1, in which said first and second ring means have a split body wall.

4. A device as in claim 1, in which the affixing means includes a weldment.

5. A device as in claim 1, in which electrical ground is a conductive wall member having an opening therein through which one of the metallic cylindrical means extends, and the affixing means includes a weldment interconnecting the wall member and said metallic cylindrical means extending through the wall member opening.

6. A device as in claim 1, in which the weldment extends completely about the wall member opening.

7. A device as in claim 1, in which the second ring means include a pair of conductive rings separated by a force transmitting means.

8. A device as in claim 1, in which the force transmitting means includes an O-ring constructed of a resilient material.

* * * * *